(12) United States Patent
Syllaios et al.

(10) Patent No.: US 8,765,514 B1
(45) Date of Patent: Jul. 1, 2014

(54) TRANSITIONED FILM GROWTH FOR CONDUCTIVE SEMICONDUCTOR MATERIALS

(75) Inventors: Athanasios J. Syllaios, Richardson, TX (US); Michael F. Taylor, Coppell, TX (US); Sameer K. Ajmera, Richardson, TX (US)

(73) Assignee: L-3 Communications Corp., New York, NY (US)

( * ) Notice: Subject to any disclaimer, the term of this patent is extended or adjusted under 35 U.S.C. 154(b) by 873 days.

(21) Appl. No.: 12/945,011

(22) Filed: Nov. 12, 2010

(51) Int. Cl.
*H01L 21/00* (2006.01)

(52) U.S. Cl.
USPC .......... 438/57; 438/48; 438/64; 257/E31.054; 257/E31.093; 257/E27.122

(58) Field of Classification Search
None
See application file for complete search history.

(56) References Cited

U.S. PATENT DOCUMENTS

| | | | |
|---|---|---|---|
| 4,169,273 A | 9/1979 | Hendrickson | |
| 4,291,815 A | 9/1981 | Gordon et al. | |
| 4,352,449 A | 10/1982 | Hall et al. | |
| 4,654,622 A | 3/1987 | Foss et al. | |
| 4,701,424 A | 10/1987 | Mikkor | |
| 4,752,694 A | 6/1988 | Hegel, Jr. et al. | |
| 4,779,124 A | 10/1988 | Hynecek | |
| 4,855,795 A * | 8/1989 | Yamamoto et al. | 257/53 |
| 5,010,251 A | 4/1991 | Grinberg et al. | |
| 5,019,887 A * | 5/1991 | Niwa et al. | 335/15 |
| 5,021,663 A | 6/1991 | Hornbeck | |
| 5,082,162 A | 1/1992 | Kamiyama et al. | |
| 5,196,377 A | 3/1993 | Wagner et al. | |
| 5,196,703 A | 3/1993 | Keenan | |
| 5,220,188 A | 6/1993 | Higashi et al. | |
| 5,260,225 A | 11/1993 | Liu et al. | |
| 5,286,671 A | 2/1994 | Kurtz et al. | |
| 5,286,976 A | 2/1994 | Cole | |
| 5,288,649 A | 2/1994 | Keenan | |
| 5,300,915 A | 4/1994 | Higashi et al. | |
| 5,367,167 A | 11/1994 | Keenan | |
| 5,367,194 A | 11/1994 | Beatty | |
| 5,404,125 A * | 4/1995 | Mori et al. | 338/18 |

(Continued)

FOREIGN PATENT DOCUMENTS

| | | |
|---|---|---|
| EP | 0828346 A2 | 3/1998 |
| EP | 0951069 A1 | 10/1999 |

(Continued)

OTHER PUBLICATIONS

Cicala et al., "Plasma Deposition of Amorphous Silicon Alloys From Fluorinated Gases", Pur & Appl. Chem., vol. 68, No. 5, pp. 1143-1149, 1996.

(Continued)

*Primary Examiner* — Seahvosh Nikmanesh
*Assistant Examiner* — Evren Seven
(74) *Attorney, Agent, or Firm* — Egan, Peterman & Enders LLP.

(57) ABSTRACT

A center region of conductive material/s may be disposed or "sandwiched" between transition regions of relatively lower conductivity materials to provide substantially low defect density interfaces for the sandwiched material. The center region and surrounding transition regions may in turn be disposed or sandwiched between dielectric insulative material to form a sandwiched and transitioned device structure. The center region of such a sandwiched structure may be implemented, for example, as a device layer such as conductive microbolometer layer for a microbolometer detector structure.

38 Claims, 8 Drawing Sheets

(56) References Cited

U.S. PATENT DOCUMENTS

| | | | |
|---|---|---|---|
| 5,431,328 A | 7/1995 | Chang et al. | |
| 5,449,910 A | 9/1995 | Wood et al. | |
| 5,450,053 A | 9/1995 | Wood | |
| 5,455,421 A | 10/1995 | Spears | |
| 5,512,748 A | 4/1996 | Hanson | |
| 5,534,111 A | 7/1996 | Hocker et al. | |
| 5,539,206 A | 7/1996 | Schimert | |
| 5,573,859 A | 11/1996 | Suppelsa | |
| 5,589,688 A | 12/1996 | Kimura et al. | |
| 5,605,489 A | 2/1997 | Gale et al. | |
| 5,659,195 A | 8/1997 | Kaiser et al. | |
| 5,672,903 A * | 9/1997 | Butler et al. | 257/467 |
| 5,701,008 A | 12/1997 | Ray et al. | |
| 5,726,480 A | 3/1998 | Pister | |
| 5,760,398 A | 6/1998 | Blackwell et al. | |
| 5,773,987 A | 6/1998 | Montoya | |
| 5,777,328 A | 7/1998 | Gooch | |
| 5,789,753 A | 8/1998 | Gooch et al. | |
| 5,825,029 A | 10/1998 | Agnese et al. | |
| 5,850,098 A * | 12/1998 | Butler et al. | 257/467 |
| 5,895,233 A | 4/1999 | Higashi et al. | |
| 5,905,007 A | 5/1999 | Ho et al. | |
| 5,912,464 A | 6/1999 | Vilain et al. | |
| 5,915,168 A | 6/1999 | Salatino et al. | |
| 5,919,548 A | 7/1999 | Barron et al. | |
| 5,921,461 A | 7/1999 | Kennedy et al. | |
| 5,923,995 A | 7/1999 | Kao et al. | |
| 5,929,441 A | 7/1999 | Beratan et al. | |
| 5,945,673 A | 8/1999 | Beratan et al. | |
| 5,970,315 A | 10/1999 | Carley et al. | |
| 6,028,312 A | 2/2000 | Wadsworth et al. | |
| 6,036,872 A | 3/2000 | Wood et al. | |
| 6,046,067 A | 4/2000 | Werner | |
| 6,054,745 A | 4/2000 | Nakos et al. | |
| 6,062,461 A | 5/2000 | Sparks et al. | |
| 6,064,216 A | 5/2000 | Farnworth et al. | |
| 6,087,199 A | 7/2000 | Pogge et al. | |
| 6,100,525 A | 8/2000 | Eden | |
| 6,111,254 A | 8/2000 | Eden | |
| 6,114,696 A | 9/2000 | Eden | |
| 6,114,697 A | 9/2000 | Eden et al. | |
| 6,119,920 A | 9/2000 | Guthrie et al. | |
| 6,133,570 A | 10/2000 | Schimert et al. | |
| 6,143,997 A | 11/2000 | Feng et al. | |
| 6,144,285 A | 11/2000 | Higashi | |
| 6,159,812 A | 12/2000 | Cheek et al. | |
| 6,210,988 B1 | 4/2001 | Howe et al. | |
| 6,232,150 B1 | 5/2001 | Lin et al. | |
| 6,316,770 B1 | 11/2001 | Ouvrier-Buffet et al. | |
| 6,320,189 B1 | 11/2001 | Ouvrier-Buffet et al. | |
| 6,392,232 B1 | 5/2002 | Gooch et al. | |
| 6,479,320 B1 | 11/2002 | Gooch | |
| 6,521,477 B1 | 2/2003 | Gooch et al. | |
| 6,586,831 B2 | 7/2003 | Gooch et al. | |
| 6,690,014 B1 | 2/2004 | Gooch et al. | |
| 6,777,681 B1 | 8/2004 | Schimert et al. | |
| 6,897,469 B2 | 5/2005 | Syllaios et al. | |
| 7,718,965 B1 * | 5/2010 | Syllaios et al. | 250/338.1 |
| 7,790,487 B2 * | 9/2010 | Shih et al. | 438/30 |
| 8,022,451 B2 * | 9/2011 | Nakamura | 257/293 |
| 8,143,648 B1 * | 3/2012 | Moon | 257/194 |
| 2001/0010360 A1 * | 8/2001 | Oda | 250/338.1 |
| 2002/0117668 A1 | 8/2002 | Kim | |
| 2005/0029629 A1 | 2/2005 | Noguchi et al. | 257/627 |
| 2006/0124831 A1 | 6/2006 | Schimert et al. | |
| 2008/0135758 A1 * | 6/2008 | Yang et al. | 250/338.1 |
| 2009/0140148 A1 * | 6/2009 | Yang et al. | 250/338.4 |
| 2009/0152467 A1 * | 6/2009 | Cheon et al. | 250/338.4 |
| 2009/0236525 A1 * | 9/2009 | Mitra et al. | 250/338.4 |
| 2010/0133536 A1 | 6/2010 | Syllaios et al. | |
| 2011/0049366 A1 * | 3/2011 | Yang et al. | 250/338.4 |
| 2011/0266441 A1 * | 11/2011 | Fagan et al. | 250/332 |

FOREIGN PATENT DOCUMENTS

| | | |
|---|---|---|
| EP | 0971219 A1 | 1/2000 |
| EP | 0977275 A1 | 2/2000 |
| EP | 1072875 A1 | 1/2001 |
| FR | 2780200 | 12/1999 |
| WO | WO99/50905 | 10/1999 |
| WO | WO99/67818 | 12/1999 |

OTHER PUBLICATIONS

Sedky et al., "Characterization of Bolmeters Based on Polycrystalline Silicon Germanium Alloys", IEEE Electron Device Letters, vol. 19, No. 10, Oct. 1998, 3 pgs.

Schropp et al., "Amorphous and Microcrystalline Silicon Solar Cells: Modeling, Materials and Device Technology", Kluwer Academic Publishers, 1998, pp. 20-22 and 49-50; 7 pgs.

Tissot et al., "Leti/Lir's Amorphous Silicon Uncooled Microbolometer Development", SPIE Conference on Infrared Detectors and Focal Plane Arrays V, vol. 3379, Apr. 1998, 6 pgs.

"Charge-Coupled Devices (CCD)", Silicon Far East, Printed From Internet Nov. 12, 2010 and Labeled "Copyright 2005", 2 pgs.

Search Report, PCT/US2011/001801, Dec. 20, 2012, 3 pgs.

* cited by examiner

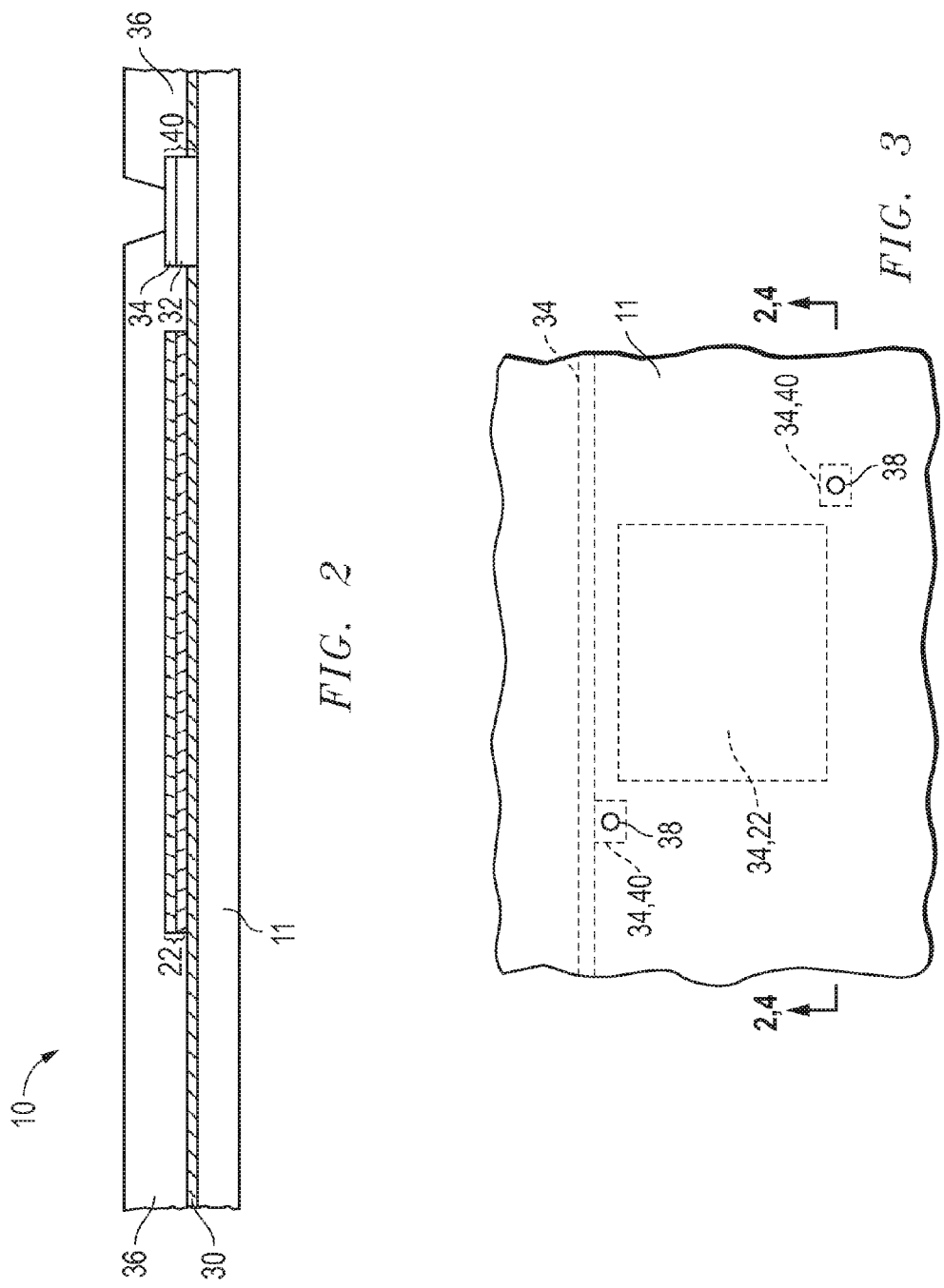

TRANSITIONED FILM GROWTH FOR CONDUCTIVE SEMICONDUCTOR MATERIALS

This invention was made with United States Government support under Contract No. NBCH3060001. The Government has certain rights in this invention.

FIELD OF THE INVENTION

This invention relates in general to device structures and more particularly to transitioned device structures and methods for forming the same.

BACKGROUND OF THE INVENTION

Infrared (IR) detectors are often utilized to detect fires, overheating machinery, planes, vehicles, people, and any other objects that emit thermal radiation. Infrared detectors are unaffected by ambient visible light conditions and often even particulate matter in the air such as smoke or fog. Thus, infrared detectors have potential use in night vision and when poor vision conditions exist, such as when normal vision is obscured by smoke or fog. IR detectors are also used in non-imaging applications such as radiometers, gas detectors, and other IR sensors.

Infrared detectors generally operate by detecting the differences in thermal radiance of various objects in a scene. That difference is converted into an electrical signal which is then processed. Microbolometers are infrared radiation detector elements that are fabricated on a substrate material largely using traditional integrated circuit fabrication techniques. Microbolometer detector arrays consist of thin, low thermal mass, thermally isolated, temperature-dependent resistive membrane structures. They are typically suspended over silicon readout integrated circuit (ROIC) wafers by long thermal isolation legs in a resonant absorbing quarter-wave cavity design.

Conventional infrared detector arrays and imagers operating at ambient temperature include microbolometer arrays made of thin films of hydrogenated amorphous silicon (a-Si:H) or vanadium oxide ($VO_x$). Other materials used for microbolometer arrays include films of various metal (e.g., titanium) and high temperature superconductors. For an array based on amorphous silicon, the detector pixel membrane is generally comprised of an ultra-thin (~2000 Å) a-$Si_xN_y$/a-Si:H/a-$Si_xN_y$ structure. The membrane is deposited at a low temperature nominally below 400° C. using silane ($SiH_4$) and ammonia ($NH_3$) precursors for the amorphous silicon nitride (a-$Si_xN_y$) layers, and using silane for the hydrogenated amorphous silicon (a-Si:H) layer. Hydrogen atoms from silane ($SiH_4$) molecules are the source of hydrogen content in the a-Si:H layer. A thin absorbing metal layer such as Titanium (Ti), Titanium-Aluminum alloy (TiAl), Nichrome (NiCr), black gold, or other material absorbing in the infrared band of interest, (e.g., at wavelength range of 1 micron to 14 micron), is inserted in the membrane to enhance infrared absorptance. Contact between the a-Si:H detector electrodes and the interconnect pads on a complementary metal oxide semiconductor (CMOS) signal processor of the ROIC is accomplished by metal interconnects. Precursors and alloy compositions of a microbolometer membrane structure may be adjusted by doping to improve stability and performance as described in U.S. Pat. No. 7,718,965.

After fabrication, microbolometers are generally placed in vacuum packages to provide an optimal environment for the sensing device. Conventional microbolometers measure the change in resistance of a detector element after the microbolometer is exposed to thermal radiation. Microbolometers have applications in gas detectors, night vision, and many other situations.

SUMMARY OF THE INVENTION

A center region of conductive material/s (e.g., semiconductor material/s) may be disposed or "sandwiched" between conductive transition regions of relatively lower conductivity materials to provide substantially low defect density interfaces for the sandwiched material. The center region and surrounding transition regions may in turn be disposed or sandwiched between dielectric insulative material to form a sandwiched structure. The presence of the transition regions surrounding the center region may be advantageously employed in one embodiment to lower defect concentration at the external interfaces of the center region to reduce interface and fixed charge effects on the center region and thus achieve reduced noise generation at a given Temperature Coefficient of Resistance (TCR) associated with current flow through the center region of semiconductor or conductive material, or to achieve increased TCR without increased noise. In one exemplary embodiment, the molecular matrix of each of the transition regions may have a matrix of substantially the same molecular structure as the molecular structure of the matrix of the conductive material center region. The center region of such a sandwiched structure may be implemented in one exemplary embodiment as a device layer such as a conductive microbolometer layer for a microbolometer detector structure.

In one exemplary embodiment, the transition regions of a sandwiched structure may each be deposited or otherwise formed to provide a region that transitions (i.e., decreases) in conductivity between a higher value of conductivity at an interface between the conductive center region and a given transition region and a lower value of conductivity at an interface between the given transition region and the surrounding dielectric insulative material. In one exemplary embodiment, each transition region may so transition in conductivity in a manner that decreases 1/f noise and improves device performance (e.g., of a microbolometer detector device) by improving reproducibility and lowering defect concentration or other noise sources within a microbolometer membrane structure.

In one disclosed embodiment, a conductive center region material may include a matrix material (e.g., such as amorphous silicon) that includes varying amounts of additional and optional materials including, but not limited to, hydrogen, germanium, fluorine, carbon, n-type dopants and p-type dopants, etc. Examples of conductive center region materials include, but are not limited to, doped fluorinated amorphous silicon materials that include at least fluorine and silicon constituents, doped or undoped amorphous silicon germanium materials that include at least silicon and germanium constituents, doped or undoped amorphous silicon carbon materials that include at least silicon and carbon constituents, doped or undoped amorphous germanium materials that include at least germanium, doped or undoped hydrogenated amorphous silicon materials, doped or undoped vanadium oxide/amorphous silicon materials that include at least silicon and vanadium oxide constituents, doped or undoped vanadium oxide materials, doped or undoped titanium oxide materials, etc. When implemented, for example, as a device layer of a microbolometer membrane, the center region may be formed to optimize center region conductivity and other device parameters (e.g., TCR) by varying the relative amount of particular constituents (e.g., silicon, hydrogen, germanium, fluorine, carbon, vanadium oxide, titanium oxide, n-type dopants, p-type dopant) and their respective chemical bonding structure within a given center region material.

In one exemplary embodiment, the transition regions of a sandwiched structure may each be composed of one or more semiconductor materials (e.g., such as conductive forms of silicon, silicon alloy, and/or other semiconductor materials). For example, microbolometer membrane structures may be formed using relatively thin and conductive semiconductor detector material films of conductive semiconductor material that are sandwiched between lower conductivity (e.g., lower doped or undoped) semiconductor material transition regions. In one embodiment, a relatively thin film of relatively lower conductivity or relatively higher resistivity (e.g., substantially non-conductive in one exemplary embodiment) undoped amorphous silicon may be grown as a transition region on an underlying silicon nitride layer of a microbolometer membrane structure, followed by growth of a relatively higher conductivity or relatively lower resistivity semiconductor detector material layer such as a-$Si_{1-x}Ge_x$. In such an embodiment, such relatively thin undoped transition regions may be provided to have high relative reproducibility, and may serve as a seed layer to grow a-$Si_{1-x}Ge_x$ with various Ge concentrations and doping levels/materials. In such an embodiment, the microbolometer detector materials may be used to form membrane structures of, for example, microbolometer infrared detector elements.

In another exemplary embodiment, transition regions may be deposited (simultaneously or sequentially) on either side of a center region that has a material matrix with substantially the same molecular structure as the molecular structure of the matrix of the transition regions. For example, a microbolometer infrared detector element pixel may be provided that includes a suspended membrane of conductive detector material (e.g., having an amorphous silicon, titanium oxide, vanadium oxide matrix material, etc.) that is disposed between two layers of amorphous-silicon nitride that support and adjust the overall stress of the membrane. A transition region having substantially the same molecular structure as the matrix of the conductive detector material but being relatively lower in conductivity than the conductive detector material may be provided between each layer of amorphous-silicon nitride and the detector layer. As disclosed herein, such microbolometer infrared detector elements may be provided in one embodiment in the form of microbolometer bridge structures that may be used to form large arrays. Further, the microbolometer pixel optical design of a microbolometer infrared detector element pixel may be of any suitable configuration, for example, a refractive resonant cavity or a diffractive resonant cavity (DRC).

In one respect, disclosed herein is an infrared detector element including: a substrate; and an infrared detector membrane disposed in spaced relationship above the substrate. The infrared detector membrane may include: a first dielectric insulative layer, a first transition region disposed on the first dielectric insulative layer, a conductive center region disposed on the first transition region, a second transition region disposed on the conductive center region, and a second dielectric insulative layer disposed on the second transition region. At least a portion of each of the first and second conductive transition regions may have a lower conductivity than the conductive center region and a greater conductivity than the first and second dielectric insulative layers.

In another respect, disclosed herein is a transitioned device structure, including: a first dielectric insulative layer; a first transition region disposed on the first dielectric insulative layer; a conductive center region disposed on the first transition region, the conductive center region forming a current conduction channel for the device structure; a second transition region disposed on the conductive center region, and a second dielectric insulative layer disposed on the second transition region. At least a portion of each of the first and second transition regions may have a lower conductivity than the conductive center region and a greater conductivity than the first and second dielectric insulative layers so as to space the current conduction channel apart from the interface with each of the first and second dielectric insulative layers in a manner that shields the current conduction channel from the interface with each of the first and second dielectric insulative layers.

In another respect, disclosed herein is a method for making an infrared detector element, including: providing a substrate; and forming an infrared detector membrane. The infrared detector membrane may be formed by: forming a first dielectric insulative layer in spaced relationship above a surface of the substrate, forming a first transition region disposed on the first dielectric insulative layer, forming a conductive center region disposed on the first transition region, forming a second transition region disposed on the conductive center region, and forming a second dielectric insulative layer disposed on the second transition region. At least a portion of each of the first and second conductive transition regions may have a lower conductivity than the conductive center region and a greater conductivity than the first and second dielectric insulative layers.

In another respect, disclosed herein is a method for making a transitioned device structure, including: forming a first dielectric insulative layer; forming a first transition region disposed on the first dielectric insulative layer; forming a conductive center region disposed on the first transition region to create a current conduction channel for the transitioned device structure; forming a second transition region disposed on the conductive center region; and forming a second dielectric insulative layer disposed on the second transition region. At least a portion of each of the first and second transition regions may be formed to have a lower conductivity than the conductive center region and a greater conductivity than the first and second dielectric insulative layers so as to space the current conduction channel apart from the interface with each of the first and second dielectric insulative layers in a manner that shields the current conduction channel from the interface with each of the first and second dielectric insulative layers.

BRIEF DESCRIPTION OF THE DRAWINGS

FIG. 2 is a cross-section illustration of a partially formed microbolometer of one embodiment disclosed herein.

FIG. 3 is a diagram illustrating the partially fabricated microbolometer after completing the steps illustrated in FIG. 2.

DESCRIPTION OF ILLUSTRATIVE EMBODIMENTS

Figure 1A:
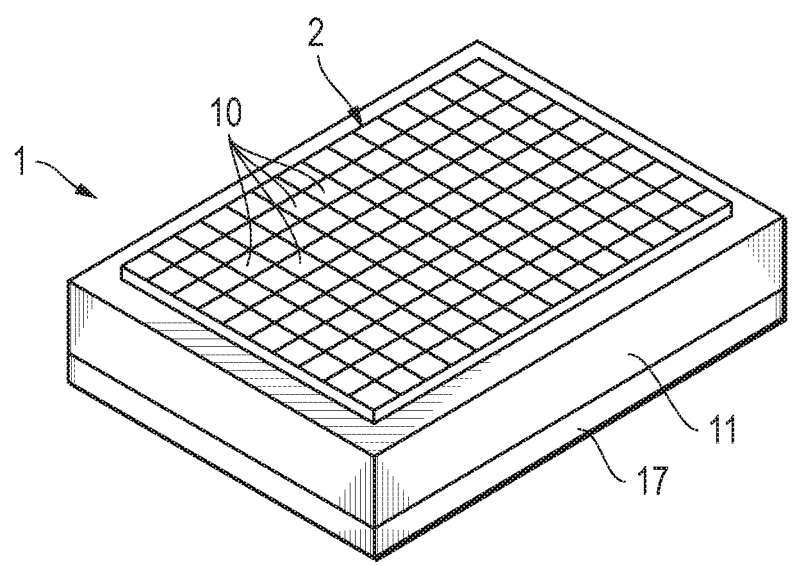
FIG. 1A is a perspective view of an infrared detector according to one embodiment disclosed herein.

FIG. 1A is a diagrammatic perspective view of one embodiment of an infrared detector 1 which is capable of sensing thermal energy and of outputting electrical signals representative of a two-dimensional image of that sensed thermal energy. The infrared detector 1 includes a focal plane array 2 disposed on a substrate 11. The substrate 11 may include an integrated circuit of a type which is commonly known as a read out integrated circuit (ROIC). The ROIC reads out the thermal information gathered by the focal plane array 2. A thermal element 17 may be optionally provided on the side of the substrate 11 opposite from the focal plane array 2, in order to serve as a form of controlled heat sink which maintains the integrated circuit substrate 11 at a substantially constant temperature which is predefined. The constant temperature prevents ambient or internally generated temperature gradients from affecting operation of the focal plane 2, and thus provides a baseline with which the thermal energy impinging on the focal plane array 2 may be more accurately measured.

Figure 1B:
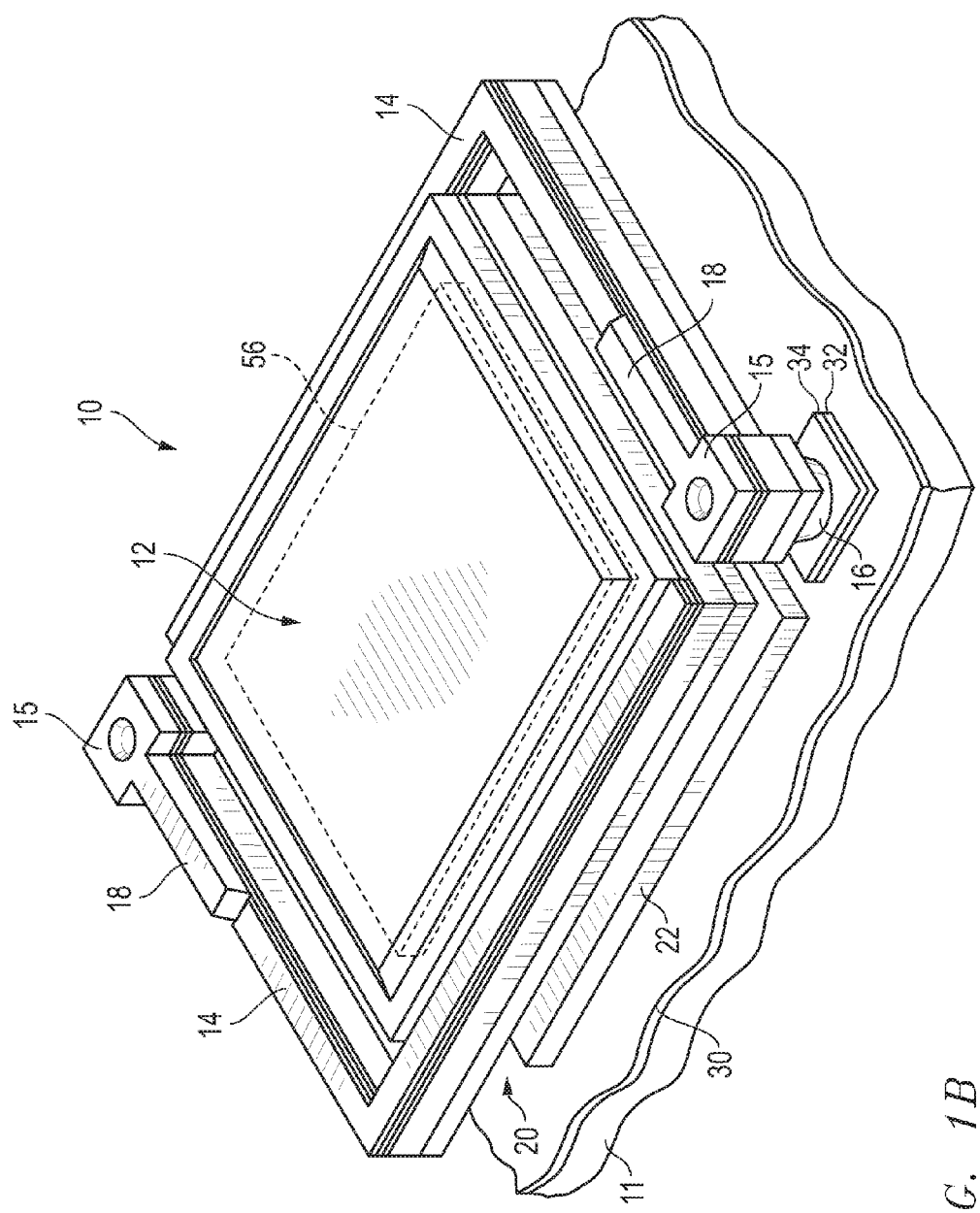
FIG. 1B is a perspective of a microbolometer infrared detector element formed on a substrate in accordance with one embodiment disclosed herein.

The focal plane 2 of this exemplary embodiment includes a plurality of microbolometer detector elements 10 that may each include transitioned membrane detector layers configured in a manner as will be described further herein. The detector elements 10 are arranged in a two-dimensional array, and each detector element 10 corresponds to a respective pixel in each image detected by the infrared detector 1. The focal plane array 2 of one disclosed embodiment includes, for example, 76,800 detector elements 10, which are arranged in a 320 by 240 array. For clarity, however, FIG. 1A diagrammatically depicts only about 140 detector elements. It will be recognized that the total number of detector elements 10 in the focal plane array 2 could be larger or smaller. Further, even though FIG. 1A shows the detector elements 10 arranged in a two-dimensional array, they could alternatively be arranged in a one-dimensional array, or could be provided at arbitrary locations that do not conform to a specific pattern. With reference to FIG. 1B, one of the detector elements 10 of FIG. 1A will be described in more detail.

More specifically, FIG. 1B is a diagrammatic fragmentary perspective view of a portion of the integrated circuit substrate 11, which has one of the detector elements 10 on it that is formed in the configuration of a microbolometer infrared detector element in accordance with one exemplary embodiment disclosed herein. In the disclosed embodiment, the detector elements all have the same structural configuration, and therefore only one of them is illustrated and described here in detail. In this embodiment, microbolometer infrared detector element 10 is formed on a substrate 11. Substrate 11 may be any suitable substrate material including a monocrystalline silicon wafer or a silicon wafer containing a readout integrated circuit (ROIC). In this embodiment, microbolometer infrared detector element 10 is a sensor that is operable to detect infrared radiation. It will be understood, however, that the transitioned membrane detector layers disclosed herein may be employed in other embodiments of detectors that are capable of detecting radiation other than infrared radiation, such as Ultraviolet (UV), Visible (VIS), or Terahertz (THz).

Still referring to FIG. 1B, microbolometer infrared detector element 10 includes thermal isolation legs 14 coupled to a detector membrane 12. Infrared radiation absorbed by the detector membrane 12 results in a measurable change in the resistance of the material comprising the detector. Detector membrane 12 is suspended over the surface of substrate 11 by thermal isolation legs 14. Construction of the detector membrane 12 may be in several layers of various materials as discussed in further detail below. In this exemplary embodiment, two thermal isolation legs 14 are each coupled along a side of detector membrane 12 and each proceeds as shown unattached along a second, adjacent side to an electrode terminal end 15. A post 16 is coupled to the electrode terminal end 15 of thermal isolation leg 14. Post 16 provides structural support and electrical connection for microbolometer 10. Electrical circuitry connected to post 16 provides a constant voltage across the membrane 12 via the thermal isolation legs 14 and senses a change in electrical current flowing through detector material of the detector membrane 12. The magnitude of the change in electrical current varies with the amount of infrared radiation detected. In an alternate embodiment, the electrical circuitry may provide a constant electrical current flowing through detector membrane 12 and senses a change in the voltage across the two posts 16. It will be understood that alternative embodiments of ROIC circuitry may be coupled to posts 16 to measure the resistance change of membrane 12 as infrared radiation is absorbed. Such alternative ROIC embodiments include, but are not limited to, constant bias or constant current as previously mentioned, AC biased, pulsed biased, and voltage ramped.

The thermal mass of microbolometer 10 affects the thermal isolation, response time, operating frequency, and sensitivity. By fabricating a microbolometer with minimal thermal mass, high sensitivity and high operating frequency may be realized. Thermal isolation of microbolometer 10 from substrate 11 also affects the operating frequency and sensitivity. Increased thermal isolation of detector membrane 12 from substrate 11 increases the sensitivity of microbolometer 10 since less infrared energy is necessary to raise the temperature of detector membrane 12. Thermal isolation also affects the operating frequency and response time of microbolometer 10 since it affects the cooling rate of detector membrane 12. An increase in thermal isolation results in a corresponding decrease in cooling rate of detector membrane 12 and, thus, a corresponding decrease in operating frequency of microbolometer 10.

In one embodiment, a single step in the fabrication of microbolometer 10 may be optionally modified to place a thermal shunt 18 on thermal isolation legs 14 coupled to posts 16 to decrease the thermal isolation of microbolometer 10. Placing a thermal shunt 18 on thermal isolation leg 14 will increase the operating frequency of microbolometer 10 since the cooling rate of detector membrane 12 is increased. Thermal shunt 18 on thermal isolation legs 14 also results in decreased sensitivity since more thermal coupling between detector membrane 12 and substrate 11 exists. Thus, an increased amount of infrared radiation energy is necessary to increase the temperature of detector membrane 12 resulting in a corresponding change in the electrical resistance of the detector. By varying the length of thermal shunt 18, and thus the amount of thermal shunt material deposited on thermal isolation legs 14, a microbolometer 10 with differing operating frequency and sensitivity characteristics may be fabricated.

As shown for the exemplary embodiment of FIG. 1B, beneath detector membrane 12 is an antireflective structure resonant cavity 20. Antireflective structure resonant cavity 20 functions to minimize the amount of infrared radiation unabsorbed by detector membrane 12 and may be present in one embodiment to enhance absorption of infrared radiation. Detector membrane 12 is suspended above the surface of substrate 11 at a height of approximately one-quarter wavelength of the infrared radiation to be detected by microbolometer 10. The one-quarter wavelength height causes infrared energy waves unabsorbed by detector membrane 12 to be reflected by reflector 22 and trapped in antireflective structure resonant cavity 20 until the infrared radiation is absorbed by detector membrane 12. Antireflective structure resonant cavity 20 creates a more efficient microbolometer 10 since the amount of infrared radiation absorbed by detector membrane 12 is maximized.

Referring now to the exemplary embodiment of FIG. 2, semiconductor substrate or integrated circuit 11 provides the base for the formation of microbolometer 10. An optional silicon dioxide or other dielectric layer 30 is formed on substrate 11. A thin layer of titanium 32 is next formed on silicon dioxide layer 30 followed by a thin layer of aluminum 34. Aluminum layer 34 and titanium layer 32 are patterned using a photoresist and etch process to form connection pads 40 for providing electrical connections to other electrical circuitry for microbolometer 10. In addition, aluminum layer 34 and titanium layer 32 are patterned to form reflector 22 for providing a reflective surface within antireflective structure resonant cavity 20 as shown in FIG. 1B. In one exemplary embodiment, microbolometer 10 is formed as a part of a readout integrated circuit (ROIC). One connection pad 40 of microbolometer 10 passes through the surface dielectric layer of the substrate 11 to make contact with the underlying electrical circuitry. The other connection pad 40 of microbolometer 10 is coupled to a common bus formed from the aluminum layer 34 on the surface of substrate 11. FIG. 3 illustrates in part aluminum layer 34 after patterning by the photoresist and etch technique. It will be understood that in another embodiment reflector 22 may be configured to perform the function of a bus that extends across the entire array, and that in such a case a separate bus (i.e., patterned from layer 34 as shown in FIG. 3) may be omitted.

As shown in FIG. 2, a polyimide layer 36 is deposited in this exemplary embodiment over the entire structure to a depth on the order of one-quarter wavelength of the infrared radiation to be detected. A one-quarter wavelength depth provides the proper spacing between reflector 22 of antireflective structure resonant cavity 20 and the bottom surface of detector membrane 12. The polyimide 36 is an organic material. Openings are etched in polyimide layer 36 to expose aluminum connection pads 40 to define post receptors 38. Post receptors 38 are holes in electrode terminal ends 15 that will eventually contain a metal post (e.g. aluminum, titanium, titanium tungsten, etc.) providing structural support and electrical connections for microbolometer 10. Post receptors 38 may be formed using a photoresist and etch technique as shown in FIG. 3 which illustrates in part the location of post receptors 38.

Figure 4:
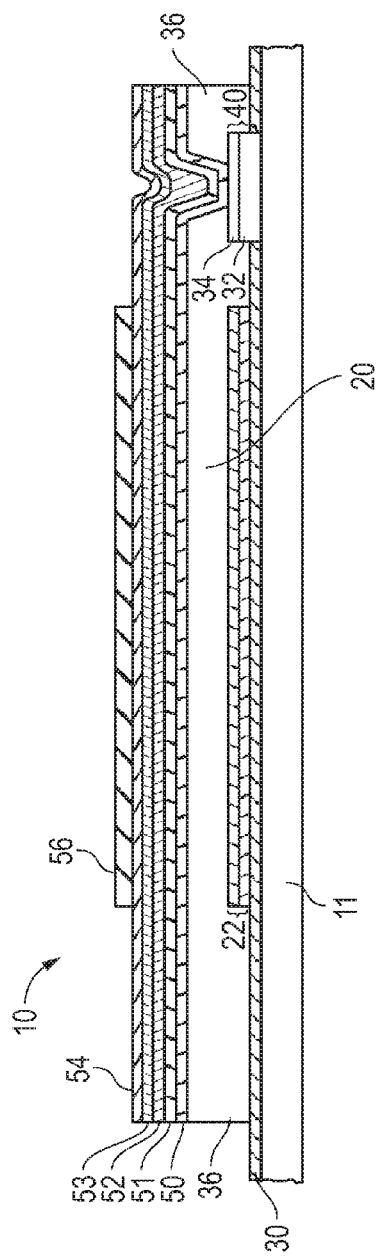
FIG. 4 is a cross-section illustration of a method of forming the microbolometer of one embodiment disclosed herein.

Referring now to FIG. 4, a first dielectric film 50 is formed on the surface of the existing structure, e.g., to a depth of from about 50 Angstroms (Å) to about 1000 Angstroms (Å), alternatively to a depth of from about 50 Angstroms (Å) to about 300 Angstroms (Å), although depths of less than about 50 Angstroms (Å) and greater than about 1000 Angstroms (Å) are also possible. In one embodiment, first dielectric film 50 may be an amorphous silicon nitride material but may be any other suitable dielectric material, e.g., silicon oxide, silicon carbide, silicon oxynitride, silicon carbonitride silicon oxycarbonitride, etc. First dielectric film 50 may be formed using, for example, PECVD or other suitable method.

A relatively thin first transition region 51 is next formed on the surface of first dielectric film 50, e.g., to a thickness of from about 30 Angstroms (Å) to about 70 Angstroms (Å), although thicknesses of less than about 30 Angstroms (Å) and greater than about 70 Angstroms (Å) are also possible. As will be described further, the first transition region 51 is selected to have a conductivity that is lower than the conductivity of a conductive center region 52 (that in this embodiment functions as a detector element layer) that is to be formed next. In one exemplary embodiment, the lower conductivity material of transition region 51 may be selected to have a matrix material (e.g., amorphous silicon, vanadium oxide, etc.) that has substantially the same molecular structure as the conductive matrix of the conductive center region (detector element layer) 52 that is to be formed next.

Next, conductive center region 52 is formed on first transition region 51 to obtain a resistive layer of conductive material to function as the device layer or detector element in microbolometer 10. Conductive center region 52 of detector membrane 12 may be formed to have a thickness of from about 250 to about 2,000 Angstroms (Å), alternatively may be about 700 Angstroms (Å). However, it will be understood that thicknesses of less than about 250 Angstroms (Å) and greater than about 2000 Angstroms (Å) are also possible.

Following formation of conductive center region 52, a second transition region 53 is next formed on the surface of detector layer 52, e.g., a thickness of from about 30 Angstroms (Å) to about 70 Angstroms (Å), although thicknesses of less than about 30 Angstroms (Å) and greater than about 70 Angstroms (Å) are also possible. As is the case with first transition region 51, the substantially non-conductive semiconductor material of non-conductive transition region 53 may also selected to have a matrix material that has substantially the same molecular structure as the semiconductor matrix of the conductive semiconductor material of a conductive center region 52. In one exemplary embodiment, all three regions 51, 52 and 53 may be deposited sequentially in a continuous deposition process within the same vacuum chamber (e.g., using PECVD), although this is not necessary.

FIG. 5 illustrates a transitioned device structure 600 that may be, for example, a section of a transitioned membrane structure of a microbolometer membrane detector element 10 such as described above in relation to FIGS. 1-5. For purposes of convenience, the same element numbers are used in FIG. 5 as employed for microbolometer membrane detector element 10 in FIG. 4. However, although described in relation to a microbolometer membrane detector element 10, it will be understood that the layered structure of transitioned device structure 600 may be employed as a part of any other type of device or in any other application that employs a conductive material disposed between dielectric insulative materials, including other types of resistive devices. Examples of such other types of device structures and/or applications include, but are not limited to, photovoltaic devices (detectors or sensors), emitters (light emitting diodes, etc.), thin film transistors (TFTs), Thermistors, Thermopiles, Thermal Flow Microsensors, etc.

Figure 5:
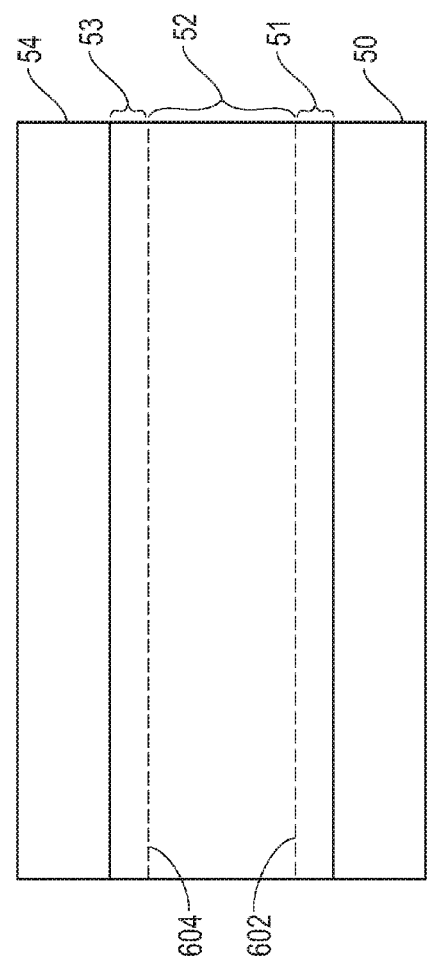
FIG. 5 is a cross-section illustration of a transitioned device structure of one embodiment disclosed herein.

As shown in FIG. 5, device structure 600 includes first and second insulative dielectric layers 50 and 54 which may each be formed, for example, of silicon nitride material ($Si_xN_y$) or any other suitable dielectric material such as silicon oxide material (SiO, $SiO_2$, $SiO_x$), silicon carbide material (SiC), silicon carbide nitride material (SiCN), organosilicate glass, etc. The particular type of material of first dielectric layer 50 may or may not be the same as the material selected for second dielectric layer 54. Thickness of first and second dielectric layers 50 may vary, but in one exemplary embodiment each of layers 50 and 54 may range from about from about 50 Angstroms (Å) to about 1000 Angstroms (Å), although greater and lesser thicknesses are possible.

Still referring to FIG. 5, a conductive material region 52 composed of one or more conductive material layers is disposed between first and second dielectric layers 50 and 54. In one exemplary embodiment, conductive material region 52 may have a thickness of about 700 Angstroms (Å), alternatively from about 50 Angstroms (Å) to about 2000 Angstroms (Å), and alternatively from about 250 Angstroms (Å) to about 700 Angstroms (Å). It will be understood that thicknesses of less than about 50 Angstroms (Å) and greater than about 2000 Angstroms (Å) are also possible. Examples of suitable conductive materials for region 52 include, but are not limited to, materials having an amorphous silicon (a-Si) matrix, an amorphous silicon germanium (a-SiGe) matrix; an amorphous silicon fluorine (a-SiF) matrix; an amorphous silicon carbon (a-SiC) matrix, a vanadium oxide matrix, a vanadium oxide amorphous silicon matrix, a titanium oxide matrix, a germanium matrix, a silicon germanium oxide (SiGeO) matrix, etc. Examples of other suitable conductive materials for region 52 include spinel materials of the formula $A^{2+}B_2^{3+}O_4^2$ in which each of A and B is a cation selected from the group of magnesium, zinc, iron, manganese, aluminum, chromium, titanium, and silicon. Another exemplary spinel matrix material is of the nickel manganite spinel type (e.g., $Ni_xMn_{3-x}O_4$).

The matrix of conductive material region 52 may include varying amounts of additional and optional materials selected in order to impart the desired conductivity characteristics to the conductive material region including, but not limited to, hydrogen, germanium, fluorine, carbon, n-type dopants and p-type dopants, nitrogen, chlorine, etc. Examples of conductive center region materials include, but are not limited to, doped amorphous silicon, doped fluorinated amorphous silicon materials that include at least fluorine and silicon constituents, doped or undoped amorphous silicon germanium materials that include at least silicon and germanium constituents, doped or undoped amorphous silicon carbon materials that include at least silicon and carbon constituents, doped or undoped hydrogenated amorphous silicon materials, doped or undoped vanadium oxide/amorphous silicon materials that include at least silicon and vanadium oxide constituents, doped or undoped vanadium oxide materials, doped or undoped titanium oxide materials, doped or undoped silicon germanium oxide, nickel manganite spinels or other spinels such as described elsewhere herein, etc. When implemented, for example, as a device layer of a microbolometer membrane, the center region may be formed to optimize center region conductivity and other device parameters such as TCR and noise characteristics by varying the relative amount of particular constituents (e.g., silicon, hydrogen, germanium, fluorine, carbon, vanadium, titanium, n-type dopants, p-type dopant, etc.) within a given center region material.

As further shown in FIG. 5, a first transition region 51 and a second transition region 53 are disposed on either side of conductive material center region 52, and between conductive semiconductor layer 52 and a corresponding one of first or second dielectric regions 50 and 54. First transition region 51 may be grown over first insulative dielectric layer 50 to provide a standard substrate for growing conductive center region 52. In this regard, transition regions 51 and 53 may be employed to present a low defect density interface with the main conductive center region. Second transition region 53 grown over the conductive center region may further serve as a substrate with low interface defects to second insulative dielectric layer 54.

In the embodiment of FIG. 5, each first and second transition region 51 and 53 positioned between the corresponding first or second insulative dielectric layer 50 or 54 and conductive center region 52 acts to reduce the effects of bulk insulative material (e.g., nitride) charges and interface charges in the interface between each insulative region 50 or 54 and its corresponding transition region 51 or 53 on the conductive center region 52. Each transition region 51 and 53 positioned between the corresponding first or second insulative dielectric layer 50 or 54 and conductive center region 52 moves the current conduction channel away from the insulative material interface thereby mitigating interface defect and fixed dielectric charge effects on noise generation by effectively shielding these regions from the current channel. In addition each transition region 51 and 53 provides a lower defect density interface to the conductive center region 52 thereby lowering noise.

As further shown, a first interface 602 is formed between first transition region 51 and conductive center region 52, and a second interface 604 is formed between second transition region 53 and conductive center region 52. Each of first and second transition regions 51 and 53 are formed of one or more material layers having lower conductivity relative to the material/s of conductive center region 52. In a further exemplary embodiment, first and/or second transition regions 51 and 53 may be composed of a material having a matrix with substantially the same molecular structure as the material matrix of center region 52.

By making the transition regions out of a substantially similar molecular structure as the center region 52, the first and second interfaces 602 and 604 contain fewer defects than an interface between materials of dissimilar molecular structure (e.g. such as an interface between $Si_xN_y$ and a-Si). In one embodiment, thermal annealing or other diffusive processes may result in interfaces 602 and 604 that are less distinct and more graded or diffuse due to diffusion of mobile constituents of conductive layer 52 (e.g., dopant chemistry, hydrogen, etc.) across the interface 602 and 604. In this way, a typical rigid transition that is full of defects (e.g., such as typically formed by adjacent materials of dissimilar molecular structure (e.g., such as $Si_xN_y$ and a-Si) that would otherwise surround the conductive channel is replaced by a gentle, low defect, graded interface. Likewise, depositing the conductive channel layer 52 on top of an interface layer of substantially similar molecular structure such as layer 51 and accompanying interface 602 makes the seed layer for deposition of layer 52 more like the layer 52 itself. This tends to yield a lower defect growth in layer 52 as the molecular structure does not significantly change across interface 602. This improved lower defect level of conductive layer 52 thus yields lower noise characteristics that are desirable for microbolometers. In contrast, depositing conductive layer 52 directly on first dielectric 50 (removing layer 51 and interface 602 for example) would yield increased defectivity in conductive layer 52 as the molecular structure would significantly change causing defectivity not only at the interface but within the bulk of the layer.

Each of first and second transition regions 51 and 53 may be further selected to be of lower conductivity or higher resistivity (and in some embodiments may be substantially non-conductive or highly resistive) relative to conductive center region 52 such that current flow in conductive center region 52 is substantially contained within center region 52 by transition regions 51 and 53. In one exemplary embodiment, the ratio of conductivity between the material of center region 52 and the material of first and second transition regions 51 and 53 may be about 20 times (20×) or greater. In such a case, the Temperature Coefficient of Resistance (TCR) of the conductive region 52 will be minorly affected by the transition regions 51 and 53. It will be understood that in other embodiments, the ratio of conductivity between the material of center region 52 and the material of first and second transition regions 51 and 53 may be about 10× or greater, alternatively may be about 5× or greater, etc. In one embodiment, each of first and second transition regions 51 and 53 may be intrinsic/substantially undoped or very low doped relative to the conductive center region 52, e.g., having from about 8 times to about 16 times lower p or n type doping levels than center region 52, although first and second transition regions 51 and 53 may have doping levels that are greater than about 16 times lower or less than about 8 times lower than center region 52. In one embodiment, either one or both of first and second transition regions 51 and 53 may be undoped. In yet another alternative embodiment, each of first and second transition regions 51 and 53 may be counter-doped relative to conductive center region 52, e.g., first and second transition regions 51 and 53 may be doped with n type dopant and counter-doped with p type dopant when center region 52 is doped only with n type dopant.

It will be understood that the relative conductivity between first and second transition regions 51, 53 and conductive center region 52 may be controlled in a variety of different ways, depending on the particular materials selected for use as these regions. Examples of ways to control conductivity include, for example, level of p or n dopants, amount of hydrogen, amount of other constituent (germanium, carbon, etc.). It will be understood that there are a variety of different ways to control conductivity of materials that may be employed for first and second transition regions 51, 53 and conductive center region 52. In this regard, any one or more layers of relatively lower conductivity material/s may be selected for use as each of first and second transition regions 51, 53 and paired with one or more layers of relatively higher conductivity material selected for conductive center region 52, with the conductivity of each of regions 51, 52 and 53 being controlled by selected compositions.

As will be understood by one skilled in the art, specific process parameters related to the specific deposition technique chosen may be used to manipulate the conductivity of the layers. For example, in the case of one embodiment using PECVD, hydrogen dilution and doping level may be used to manipulate the conductivity of each individual layer. In addition, many secondary parameters specific to the tool and technique may also be employed such as deposition temperature, pressure, gas flow rate, plasma power, substrate grounding, etc.

For example, exemplary methods of controlling conductivity of a given material to achieve a desired relative conductivity include, but are not limited to, by doping with p or n-type material (doping generally increases conductivity) and/or by varying content of another constituent (e.g., by hydrogen content, by varying germanium content, by varying carbon content, etc.) and/or by varying microcrystalline content leading to a mixed phase, etc. Table 1 lists some exemplary materials with corresponding methods that may be employed alone or in combination to control conductivity, it being understood that other types of materials and/or methods may be employed for each of regions 51, 52 and 53.

It will also be understood that either or both of transition regions 51 and 53 may be formed in a manner that either results in a material region having a conductivity that is substantially consistent across the thickness of the transition region, that increases and/or decreases across the thickness of the transition region, or that incrementally changes (or is graded) across the thickness of the given transition region 51 or 53, e.g., such that the given transition region has a relatively lower resistivity (e.g., achieved by relatively greater p or n dopant concentration) near its interface with material of conductive center region 52, and such that it has a higher resistivity (e.g., achieved by relatively lesser p or n dopant concentration) near its interface with respective corresponding dielectric layer 50 or 54, but such that a least a portion of the material of the given transition region 51 or 52 has higher a higher resistivity value than the material of the corresponding adjacent center region 52. Furthermore, it will be understood that either one or both of transition regions 51 and/or 53 may be composed of multiple material layers that are separately deposited in sequence.

TABLE 1

| Material/s for Transition Regions and/or Conductive Center Region | Method/s to Control Conductivity (May be Used in Combination) |
|---|---|
| a-Si | p or n type doping; microcrystalline content |
| a-Si:H | p or n type doping; hydrogen concentration; microcrystalline content |
| a-Si:Ge | p or n type doping; germanium concentration; microcrystalline content |
| a-Si:Ge:H | p or n type doping; germanium concentration; hydrogen concentration; microcrystalline content |
| a-Si:Ge:F | p or n type doping; germanium concentration; fluorine concentration; microcrystalline content |
| a-Si:Ge:F:H | p or n type doping; hydrogen concentration; germanium concentration; fluorine concentration ; microcrystalline content |
| a-Si:C | p or n type doping; carbon concentration; microcrystalline content |
| Vanadium Oxide | p or n type doping; varying vanadium to oxygen ratio; mixed phase content |
| Titanium Oxide | p or n type doping; varying titanium to oxygen ratio |

As an example, in one exemplary embodiment, undoped amorphous silicon (a-Si) may be selected for deposition as first transition region 51 and as second transition region 53 to sandwich a center region 52 of a conductive semiconductor material having a p or n doped amorphous silicon (a-Si) matrix to provide a center region 52 having a matrix with substantially the same molecular structure as the matrix of the first and second transition regions 51 and 53. Other specific examples of amorphous silicon materials that may be doped or otherwise formulated to provide a conductive material for use as a center region 52 having a matrix with substantially the same molecular structure as undoped amorphous silicon (a-Si) matrix employed for transition regions 51 and 53 include, but are not limited to, hydrogenated amorphous silicon (a-Si:H), fluorinated amorphous silicon (a-Si:F), hydrogenated fluorinated amorphous silicon (a-Si:H:F), amorphous silicon germanium (a-Si$_{1-x}$Ge$_x$), hydrogenated amorphous silicon germanium (a-Si$_{1-x}$Ge$_x$:H), hydrogenated fluorinated amorphous silicon germanium (a-Si$_{1-x}$Ge$_x$:H:F), amorphous silicon carbon (a-Si:C), hydrogenated amorphous silicon carbon (a-Si:C:H), etc. When appropriately doped or otherwise formulated to be relatively more conductive than the undoped a-Si of transition regions 51 and 53, each of the foregoing listed conductive semiconductor materials may be said to have a matrix with substantially the same molecular structure as undoped amorphous (a-Si). Further, each of the foregoing listed conductive semiconductor materials may be alternatively characterized as being composed of at least one matrix chemical element in common (i.e., silicon in this case) with the undoped a-Si of transition regions 51 and 53. It will be understood that other examples of center region materials and corresponding transition region materials having substantially the same matrix molecular structure or sharing a common matrix element are possible. However, in other embodiments, a center region material and either one or both of corresponding transition region materials may have respective matrices that are not substantially the same matrix molecular structure as the other region materials and/or may not share a common matrix element with the other region materials.

In Table 2 below, the matrix of each listed relatively lower conductive material has substantially the same molecular structure as the molecular structure of the respective listed conductive materials of the same row in the table. It will be understood that the listed materials in Table 2 are exemplary only, and that other relatively lower conductivity materials and/or corresponding conductive materials may be employed that have a material matrix with substantially the same molecular structure. Furthermore, it will be understood that in other embodiments, a relatively lower conductive material of one or both given transition regions may not have substantially the same molecular structure as the molecular structure of the conductive material/s of a corresponding center region surrounded by the given transition regions.

TABLE 2

| Relatively Lower Conductivity Material for Transition Regions 51 and 53 (each may optionally be p or n doped to achieve desired conductivity characteristics) | Corresponding Conductive Material for Conductive Region 52 (each may optionally be p or n doped to achieve desired conductivity characteristics) |
| --- | --- |
| a-Si | a-Si:H, a-Si:F, a-Si:H:F, a-Si$_{1-x}$Ge$_x$, a-Si$_{1-x}$Ge$_x$:H, a-Si$_{1-x}$Ge$_x$:H:F, a-Si:C, a-Si:C:H, a-Si:C:H:Ge |
| a-Si:H | a-Si:H, a-Si:F, a-Si:H:F, a-Si$_{1-x}$Ge$_x$, a-Si$_{1-x}$Ge$_x$:H, a-Si$_{1-x}$Ge$_x$:H:F, a-Si:C, a-Si:C:H, a-Si:C:H:Ge |
| a-Ge:H | a-Si$_{1-x}$Ge$_x$, a-Si$_{1-x}$Ge$_x$:H, a-Si$_{1-x}$Ge$_x$:H:F, a-Si:C:H:Ge |
| a-Ge | a-Si$_{1-x}$Ge$_x$, a-Si$_{1-x}$Ge$_x$:H, a-Si$_{1-x}$Ge$_x$:H:F, a-Si:C:H:Ge |
| VO$_x$ or TiOx | VO$_y$ with y < x |
| VO$_x$ or TiOx | TiO$_y$ with y < x |

In one embodiment, layers or films for a conductive center region may be grown to be mixed phase in composition. For example, a conductive center region that includes amorphous silicon material (alone or in combination with other constituents) may be grown near the amorphous-crystalline phase transition to result in a stable amorphous atomic structure, e.g., a material structure that contains an amount of microcrystallites that is less than or equal to about 10% by volume of the total material (as determined by Raman spectroscopy) and that are from about 1 nanometers to about 10 nanometers in size (as determined by x-ray diffraction or transmission electron microscopy—TEM). However, it will be understood that materials for a conductive center region including amorphous silicon may contain an amount of microcrystallites greater than about 10% by volume of the total material, and/or that have a size of less than about 1 nanometer or greater than about 10 nanometers. In this regard, the substrate temperature, plasma power (when using PECVD reactor) and hydrogen dilution ratio may be optionally set to drive, for example, the silicon or silicon germanium structure near the amorphous to crystalline transition where the material has stable (low energy) configuration. However, it will be understood that growth parameters may be varied to achieve desired materials for a conductive center region that have desired characteristics, including materials containing microcrystallites in an amount greater than about 10% by volume of the total material, and/or that have a size of less than about 1 nanometer or greater than about 10 nanometers. For example, higher substrate temperature, higher plasma power, and greater amounts of hydrogen dilution tend to increase the microcrystallite amount.

Materials for relatively lower transition regions and conductive center regions may be grown in one exemplary embodiment by chemical vapor deposition (CVD), such as plasma enhanced chemical vapor deposition (PECVD), using silane and optionally one or more other precursors. For example, silane, hydrogen and germane (GeH$_4$) precursors may be used to form an a-Si$_{1-x}$Ge$_x$:H alloy with specific composition "x" by adjusting the ratio of H$_2$, SiH$_4$ and GeH$_4$ flow rates. In such a case, growth parameters such as temperature, growth rate and addition of H$_2$ may be selected so that a silicon germanium alloy structure is amorphous, but near the amorphous-to-crystalline phase transition. In other embodiments, conductive semiconductor materials may be formed by any other technique that is suitable for forming the same such as sputtering, molecular beam epitaxy, etc. For example, amorphous silicon germanium (a-Si$_{1-x}$Ge$_x$) may be formed by sputtering of silicon and germanium or by molecular beam epitaxy using silicon and germanium.

In addition to PECVD, any other method/s suitable for growing materials of a conductive center material sandwiched by substantially relatively lower conductivity transition and/or dielectric layers may be employed. Examples of such alternative growth techniques include, but are not limited to, Hot Wire Chemical Vapor Deposition (HWCVD), Electron Cyclotron Resonance Chemical Vapor Deposition (ECR-CVD), Microwave CVD, etc.

It will be understood that any suitable fabrication method may be employed in the practice of the disclosed methods and apparatus. For example, any combination of sources of silicon, hydrogen, germanium, fluorine, vanadium, titanium, carbon, p-type dopant and/or n-type dopant (and relative amounts thereof) that is suitable for forming undoped or doped (p-type or n-type) materials for conductive center and/or relatively lower conductivity transition regions may be employed. For example, p-doped fluorinated amorphous silicon (a-Si:F) material film may be grown in one exemplary embodiment in a PECVD reactor from SiF$_4$ and BF$_3$ precursors, and undoped fluorinated amorphous silicon (a-Si:F) material film may be grown in one exemplary embodiment from SiF$_4$ precursor. Similarly, p-doped fluorinated amorphous silicon germanium (a-Si$_{1-x}$Ge$_x$:F) material film may be grown in one exemplary embodiment in a PECVD reactor from SiF$_4$, GeF$_4$ and BF$_3$ precursors, and undoped fluorinated amorphous silicon germanium (a-Si$_{1-x}$Ge$_x$:F) material film may be grown in one exemplary embodiment from SiF$_4$ and GeF$_4$ precursors. It will also be understood that the particular parameter values and parameter value ranges (e.g., precursor amounts and ranges of precursor amounts) may be employed.

Examples of other dopant precursors include, but are not limited to $B_2$, $PH_3$, $BCl_3$, $B_2H_6$, etc. Examples of other doping methodologies include, but are not limited to, ion implantation.

In this regard, the values of the growth parameters, such as the precursor gas flow rates, may be determined and set appropriately for the various desired final material composition, e.g., such as Ge composition "x" value. Further, it will be understood that PECVD reactor parameters (e.g., LF/HF power density and duty cycle may vary), and that the amount of precursors (e.g., $SiH_4$ and/or $H_2$) that may be provided in argon plasma or other suitable diluent plasma (e.g., helium plasma) may be varied (e.g., greater than about 5% or less than about 5%) as needed or desired to form the indicated material of each table. As will be understood by one skilled in the art, specific deposition parameters are directly related to the specific tool and vary from tool to tool across various tool configurations, manufacturers, tool geometries, etc. In one exemplary embodiment, each of transition regions 51 and 53 may be formed in helium plasma, and conductive center region 52 may be formed in argon plasma.

Tables 3-14 illustrate various possible exemplary embodiments of materials that may be selected for each of the layers or regions of transitioned device structure 600.

TABLE 3

| Layer or Region | Material |
| --- | --- |
| Dielectric 54 | silicon nitride, silicon oxide, silicon carbide, silicon carbide nitride, organosilicon glass; SiCO |
| Upper Transition Region 53 | amorphous silicon |
| Center Region 52 | silicon germanium (e.g., doped or with relative ratio of silicon to germanium selected to achieve conductivity of region 52 that is greater than conductivity of regions 51 and 53) |
| Lower Transition Region 51 | amorphous silicon |
| Dielectric 50 | silicon nitride, silicon oxide, silicon carbide, silicon carbide nitride, organosilicon glass, SiCO |

TABLE 4

| Layer or Region | Material |
| --- | --- |
| Dielectric 54 | silicon nitride, silicon oxide, silicon carbide, silicon carbide nitride, organosilicon glass |
| Upper Transition Region 53 | vanadium oxide |
| Center Region 52 | vanadium oxide (e.g., doped or with relative ratio of vanadium to oxide selected to achieve conductivity of region 52 that is greater than conductivity of regions 51 and 53) |
| Lower Transition Region 51 | vanadium oxide |
| Dielectric 50 | silicon nitride, silicon oxide, silicon carbide, silicon carbide nitride, organosilicon glass |

TABLE 5

| Layer or Region | Material |
| --- | --- |
| Dielectric 54 | silicon nitride, silicon oxide, silicon carbide, silicon carbide nitride, organosilicon glass |
| Upper Transition Region 53 | amorphous silicon |
| Center Region 52 | titanium oxide (e.g., doped or with relative ratio of titanium to oxide selected to achieve conductivity of region 52 that is greater than conductivity of regions 51 and 53) |
| Lower Transition Region 51 | amorphous silicon |
| Dielectric 50 | silicon nitride, silicon oxide, silicon carbide, silicon carbide nitride, organosilicon glass |

TABLE 6

| Layer or Region | Material |
| --- | --- |
| Dielectric 54 | silicon nitride, silicon oxide, silicon carbide, silicon carbide nitride, organosilicon glass |
| Upper Transition Region 53 | titanium oxide |
| Center Region 52 | vanadium oxide (e.g., doped or with relative ratio of vanadium to oxide selected to achieve conductivity of region 52 that is greater than conductivity of regions 51 and 53) |
| Lower Transition Region 51 | titanium oxide |
| Dielectric 50 | silicon nitride, silicon oxide, silicon carbide, silicon carbide nitride, organosilicon glass |

TABLE 7

| Layer or Region | Material |
| --- | --- |
| Dielectric 54 | silicon nitride, silicon oxide, silicon carbide, silicon carbide nitride, organosilicon glass |
| Upper Transition Region 53 | titanium oxide |
| Center Region 52 | titanium oxide (e.g., doped or with relative ratio of titanium to oxide selected to achieve conductivity of region 52 that is greater than conductivity of regions 51 and 53) |
| Lower Transition Region 51 | titanium oxide |
| Dielectric 50 | silicon nitride, silicon oxide, silicon carbide, silicon carbide nitride, organosilicon glass |

TABLE 8

| Layer or Region | Material |
| --- | --- |
| Dielectric 54 | silicon nitride, silicon oxide, silicon carbide, silicon carbide nitride, organosilicon glass |
| Upper Transition Region 53 | vanadium oxide |
| Center Region 52 | titanium oxide(e.g., doped or with relative ratio of titanium to oxide selected to achieve conductivity of region 52 that is greater than conductivity of regions 51 and 53) |
| Lower Transition Region 51 | vanadium oxide |
| Dielectric 50 | silicon nitride, silicon oxide, silicon carbide, silicon carbide nitride, organosilicon glass |

TABLE 9

| Layer or Region | Material |
| --- | --- |
| Dielectric 54 | silicon nitride, silicon oxide, silicon carbide, silicon carbide nitride, organosilicon glass |
| Upper Transition Region 53 | amorphous silicon |
| Center Region 52 | vanadium oxide (e.g., doped or with relative ratio of vanadium or oxide selected to achieve conductivity of region 52 that is greater than conductivity of regions 51 and 53) |
| Lower Transition Region 51 | amorphous silicon |
| Dielectric 50 | silicon nitride, silicon oxide, silicon carbide, silicon carbide nitride, organosilicon glass |

TABLE 10

| Layer or Region | Material |
| --- | --- |
| Dielectric 54 | silicon nitride, silicon oxide, silicon carbide, silicon carbide nitride, organosilicon glass |
| Upper Transition Region 53 | amorphous silicon with relatively low hydrogen concentration relative to center region 52 |
| Center Region 52 | amorphous silicon with relatively high hydrogen concentration relative to upper transition region 53 and lower transition region 51 |
| Lower Transition Region 51 | amorphous silicon with relatively low hydrogen concentration relative to center region 52 |
| Dielectric 50 | silicon nitride, silicon oxide, silicon carbide, silicon carbide nitride, organosilicon glass |

TABLE 11

| Layer or Region | Material |
| --- | --- |
| Dielectric 54 | silicon nitride, silicon oxide, silicon carbide, silicon carbide nitride, organosilicon glass |
| Upper Transition Region 53 | amorphous silicon with relatively high hydrogen concentration relative to center region 52 |
| Center Region 52 | amorphous silicon with relatively low hydrogen concentration relative to upper transition region 53 and lower transition region 51 |
| Lower Transition Region 51 | amorphous silicon with relatively high hydrogen concentration relative to center region 52 |
| Dielectric 50 | silicon nitride, silicon oxide, silicon carbide, silicon carbide nitride, organosilicon glass |

TABLE 12

| Layer or Region | Material |
| --- | --- |
| Dielectric 54 | silicon nitride, silicon oxide, silicon carbide, silicon carbide nitride, organosilicon glass |
| Upper Transition Region 53 | amorphous silicon with relatively low hydrogen concentration relative to center region 53 |
| Center Region 52 | amorphous silicon with relatively high hydrogen concentration relative to upper transition region 53 |
| Lower Transition Region 51 | undoped or lightly doped amorphous silicon |
| Dielectric 50 | silicon nitride, silicon oxide, silicon carbide, silicon carbide nitride, organosilicon glass |

TABLE 13

| Layer or Region | Material |
| --- | --- |
| Dielectric 54 | silicon nitride, silicon oxide, silicon carbide, silicon carbide nitride, organosilicon glass |
| Upper Transition Region 53 | undoped or lightly doped amorphous silicon |
| Center Region 52 | amorphous silicon with relatively high hydrogen concentration relative to lower transition region 51 |
| Lower Transition Region 51 | amorphous silicon with relatively low hydrogen concentration relative to center region 52 |
| Dielectric 50 | silicon nitride, silicon oxide, silicon carbide, silicon carbide nitride, organosilicon glass |

TABLE 14

| Layer or Region | Material |
| --- | --- |
| Dielectric 54 | silicon nitride, silicon oxide, silicon carbide, silicon carbide nitride, organosilicon glass |
| Upper Transition Region 53 | amorphous silicon with relatively low dopant concentration relative to center region 52 |
| Center Region 52 | amorphous silicon with relatively high dopant concentration relative to at least one of upper transition region 53, lower transition region 51, or both transition regions 51 and 53 |
| Lower Transition Region 51 | amorphous silicon with relatively low dopant concentration relative to center region 52 |
| Dielectric 50 | silicon nitride, silicon oxide, silicon carbide, silicon carbide nitride, organosilicon glass |

It will be understood that one region may be higher doped relative to another region but have a hydrogen dilution concentration that is tuned to have a lower conductivity still.

Returning to the exemplary embodiment of FIG. 4, the deposition of regions 51, 52, and 53 may take place in one embodiment at a temperature just below that which will degrade polyimide layer 36 (e.g., from about 360° C. to about 450° C., alternatively at about 365° C.). A second dielectric film 54 is then deposited on upper transition region to a depth of from about 50 Angstroms (Å) to about 1000 Angstroms (Å), alternatively to a depth of about 250 Angstroms (Å), although depths of less than about 50 Angstroms (Å) and greater than about 1000 Angstroms (Å) are also possible.

Still referring to the exemplary embodiment of FIG. 4, if conductive center region 52 is transparent to infrared radiation, a material sensitive to infrared radiation is used to thermally transfer energy absorbed from the infrared radiation. A thin metal absorber film 56 is deposited on second dielectric film 54 to a thickness of from about 50 to about 150 Angstroms (Å), alternatively from about 50 to about 200 Angstroms (Å), although thicknesses less than about 50 Angstroms (Å) and greater than about 200 Angstroms (Å) are also possible. In one embodiment, thin metal absorber film 56 may be titanium but alternatively may be any other suitable material that will absorb infrared radiation. Thin metal absorber film 56 is patterned to leave an absorber area on detector membrane 12. Absorber 56 may be patterned using a photoresist and etch technique, or other available techniques such as by a photoresist liftoff method.

Figure 6:
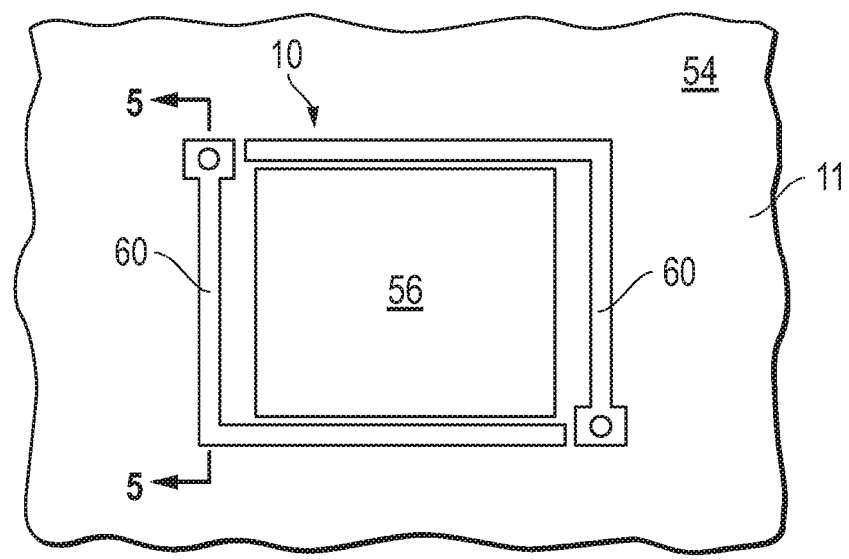
FIG. 6 is a diagram illustrating a partially fabricated microbolometer after completion of the steps illustrated in FIG. 4.

FIG. 6 illustrates in part the location of absorber 56 in relation to the structure of microbolometer 10 formed on substrate 11 according to one exemplary embodiment. Absorber 56 absorbs heat from infrared radiation and transfers the heat to conductive center region 52 that functions as a detector element layer in this exemplary embodiment. Although second dielectric film 54 provides electrical insulation for conductive center region 52, it does not thermally isolate conductive center region 52 from absorber 56. Thus, conductive center region 52 is thermally coupled to absorber 56 resulting in the transfer of thermal energy from absorber 56 to conductive center region 52. As conductive center region 52 increases in temperature, the electrical resistance of conductive center region 52 changes. The change in electrical resistance is measured and processed to yield a quantity of infrared radiation present in the detection area. Any infrared radiant energy not absorbed by absorber 56 passes through the structure, reflects off reflector 22, and becomes trapped in antireflective structure resonant cavity 20 such that absorber 56 absorbs the trapped infrared radiant energy with high overall efficiency. Therefore, absorber 56 absorbs infrared radiant energy both as it passes through detector membrane 12 and after it becomes trapped in antireflective structure resonant cavity 20.

Still referring to the exemplary embodiment of FIG. 6, the outer surface of the second dielectric film 54 is patterned and openings are etched to expose portions of the outer surface of conductive center region 52 to define thermal isolation leg structure 60. In this embodiment, the second dielectric film layer 54 may be patterned and etched, for example, using a photoresist and etch technique. Further details on structure, materials and fabrication techniques for microbolometer detector elements may be found in U.S. Pat. No. 6,586,831, U.S. Pat. No. 6,521,477, U.S. Pat. No. 6,479,320, U.S. Pat. No. 6,897,469, U.S. Pat. No. 6,777,681, U.S. Pat. No. 6,690,014, and U.S. Pat. No. 7,718,965, each of which is incorporated herein by reference in its entirety for all purposes.

Figure 7:
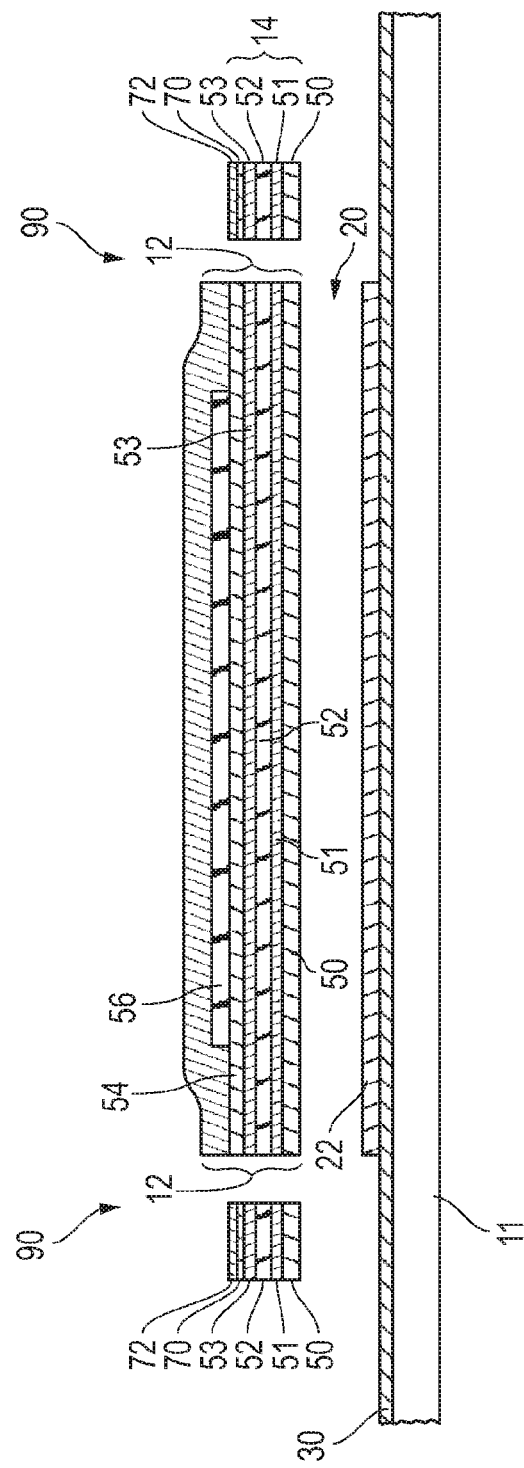
FIG. 7 is a cross-section illustration of a completed microbolometer of one embodiment disclosed herein.

FIG. 7 illustrates a completed microbolometer for one exemplary embodiment. As shown in FIG. 7, thermal isolation leg gaps 90 show all layers above polyimide layer 36 that have been removed in the areas where there is no microbolometer 10 structure. Further, polyimide layer 36 may be removed by exposing the structure to an oxygen or other reactive plasma dry etch. As further shown in FIG. 7, second dielectric film 54 has been patterned with openings etched to define thermal isolation leg structure 60 of FIG. 6, and thin electrode metal layer 70 has been deposited in thermal isolation leg structure 60. In some embodiments, electrode layer 70 and absorber layer 56 may be the same material deposited either at the same time or in different steps. A third dielectric film 72 has been deposited on the surface of the structure.

Figure 8:
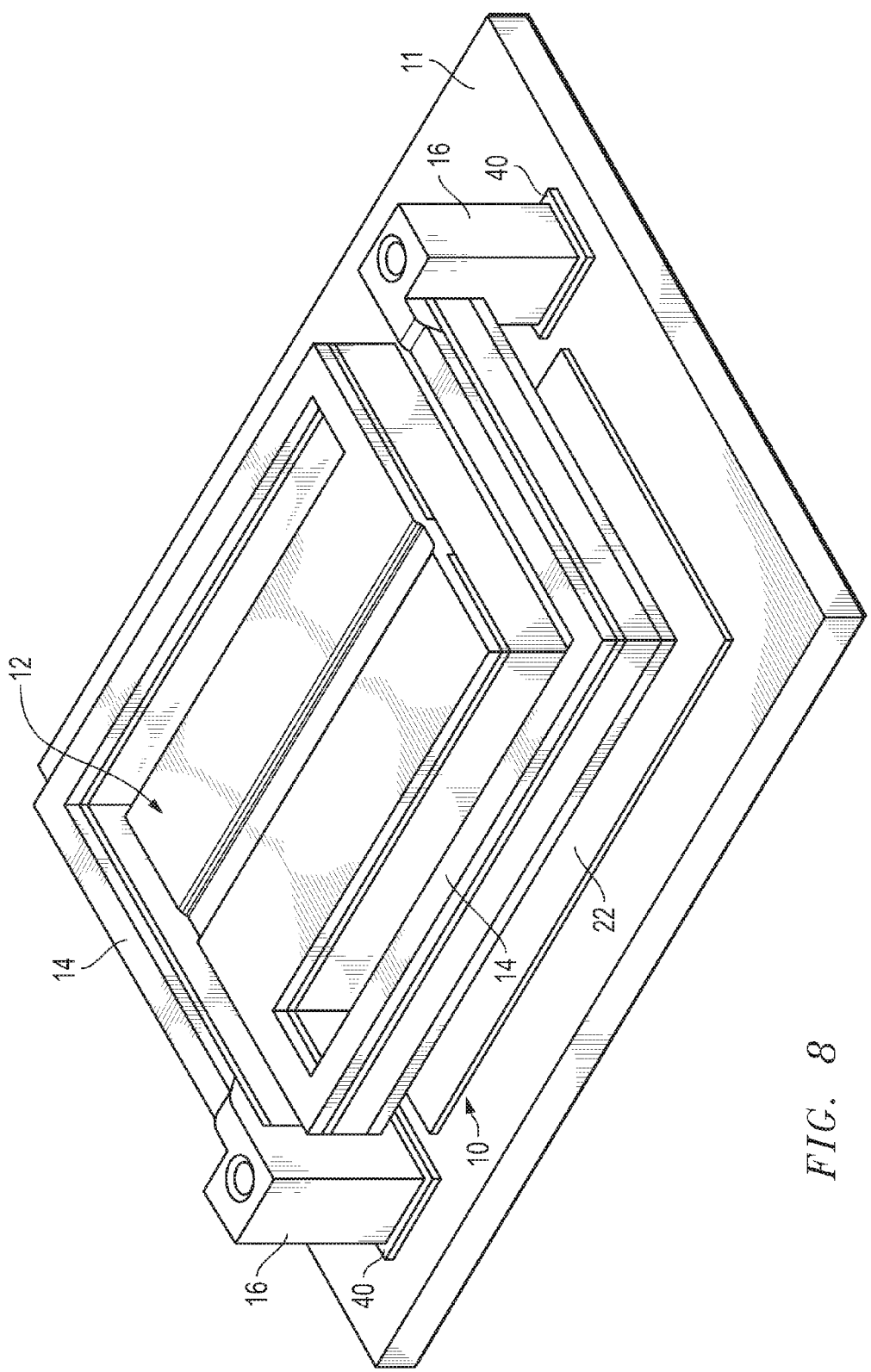
FIG. 8 is a perspective of a microbolometer infrared detector element formed on a substrate in accordance with one embodiment disclosed herein.
Figure 9:
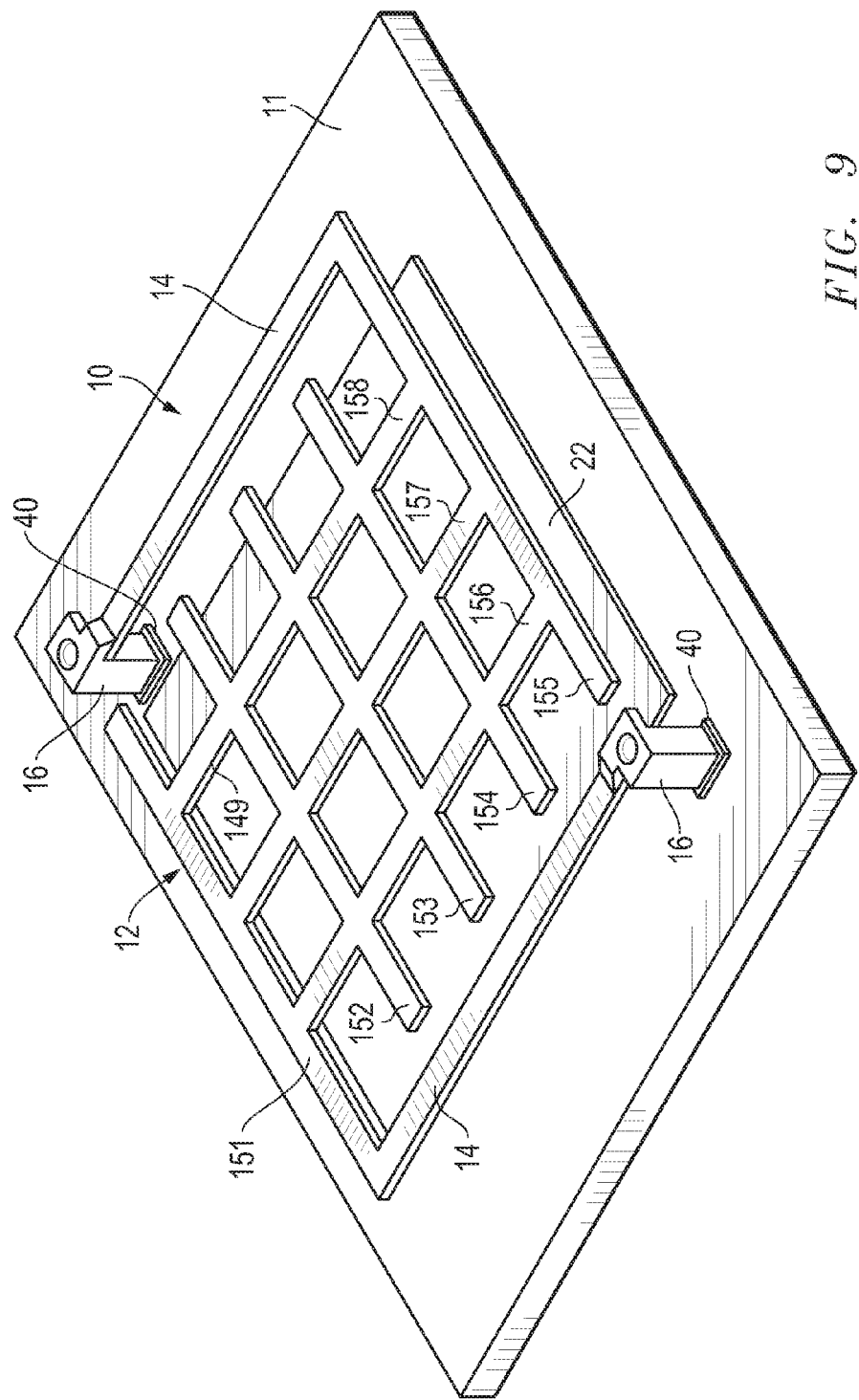
FIG. 9 is a perspective of a microbolometer infrared detector element formed on a substrate in accordance with one embodiment disclosed herein.

The disclosed materials may be employed, for example, with microbolometer infrared detector structures and methods for forming the same that are illustrated in described in U.S. Pat. No. 6,777,681 and U.S. Pat. No. 6,690,014, each of which is incorporated herein by reference. In this regard, the disclosed conductive center region material sandwiched between two relatively lower conductivity transition region materials may be employed in the place of amorphous silicon layers of microbolometer infrared detector structures described in these references. As an example, FIGS. 8 and 9 herein illustrate alternative exemplary embodiments of microbolometer infrared detector elements 10 having membranes 12 that may include the transition and center regions described herein. Such microbolometer detector element configurations are described in further detail in U.S. Pat. No. 6,777,681. In particular, FIG. 9 illustrates a microbolometer infrared detector element 10 having diffractive resonance cavity structure in which membrane 12 has 16 openings 149 provided through it, in a cross-grating pattern which forms a four-by-four array (grid) of openings. Due to the presence of the openings, the membrane 12 may be viewed as having five spaced and parallel strips 151-155 that extend in one direction, and three spaced and parallel strips 156-158 that extend from the strip 151 to the strip 155 in a direction perpendicular to the strips 151-155. It will be understood that FIGS. 8 and 9 are exemplary only, and that the disclosed transition and center region materials may be employed as layers in microbolometer infrared detector structures of other configurations, e.g., employed in the place of conventional amorphous silicon or VOx layers in microbolometer infrared detector structures.

Additionally, microbolometer infrared detector elements formed from the disclosed transition and center region materials may be employed to form focal plane arrays that may be packaged, for example, using vacuum packaging techniques described and illustrated in U.S. Pat. No. 6,586,831, U.S. Pat. No. 6,521,477, U.S. Pat. No. 6,479,320, U.S. Pat. No. 6,897,469, and U.S. Pat. No. 7,718,965, each of which is incorporated herein by reference in its entirety.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed structures, systems and methods may be utilized in various combinations and/or independently. Thus the invention is not limited to only those combinations shown herein, but rather may include other combinations.

What is claimed is:

1. An infrared detector element comprising:
    a substrate; and
    an infrared detector membrane disposed in spaced relationship above the substrate;
    where the infrared detector membrane comprises:
        a first dielectric insulative layer,
        a first transition region disposed on the first dielectric insulative layer,
        a conductive center region disposed on the first transition region,
        a second transition region disposed on the conductive center region, and
        a second dielectric insulative layer disposed on the second transition region;
    where at least a portion of each of the first and second transition regions has a lower conductivity than the conductive center region and a greater conductivity than the first and second dielectric insulative layers.

2. The infrared detector element of claim 1, where a material matrix of the conductive center region comprises at least one of an amorphous silicon matrix, an amorphous silicon germanium matrix; an amorphous silicon fluorine matrix; an amorphous silicon carbon matrix, a vanadium oxide matrix, a vanadium oxide amorphous silicon matrix, a titanium oxide matrix, a germanium matrix, a silicon germanium oxide matrix, or a nickel manganite spinel matrix.

3. The infrared detector element of claim 1, where a material matrix of the conductive center region comprises amorphous silicon.

4. The infrared detector element of claim 1, where a material matrix of the conductive center region comprises vanadium oxide.

5. The infrared detector element of claim 1, where each of the first transition region, second transition region and conductive center region has a material matrix; and where the material matrix of each of the transition regions has substantially the same molecular structure as the molecular structure of the matrix of the conductive center region.

6. The infrared detector element of claim 5, where the material matrix of each of the first transition region, second transition region and conductive center region comprises a semiconductor.

7. The infrared detector element of claim 6, where the conductive center region further comprises at least one additional material in an amount sufficient to impart a conductivity to the conductive center region that is greater than the conductivity of the first and second transition regions.

8. The infrared detector element of claim 6, where the conductive center region further comprises at least one additional material in an amount sufficient to impart a conductivity to the conductive center region that is greater than the conductivity of the first and second transition regions; and where the additional material comprises at least one of hydrogen, germanium, fluorine, carbon, n-type dopant, p-type dopant, or a combination thereof.

9. The infrared detector element of claim 1, where a material matrix of each of the first transition region, second transition region and conductive center region comprises amorphous silicon.

10. The infrared detector element of claim 1, where a material matrix of each of the first transition region, second transition region and conductive center region comprises vanadium oxide.

11. The infrared detector element of claim 1, where at least one of the following conditions exists:
the first transition region decreases in conductivity in a graded manner between a higher value of conductivity at an interface between the conductive center region and the first transition region, and a lower value of conductivity at an interface between the first transition region and the first dielectric insulative layer; or
the second transition region decreases in conductivity in a graded manner between a higher value of conductivity at an interface between the conductive center region and the second transition region, and a lower value of conductivity at an interface between the second transition region and the second dielectric insulative layer; or a combination thereof.

12. The infrared detector element of claim 1, where the substrate comprises read out integrated circuitry (ROIC); and where the infrared detector membrane is suspended in spaced relationship above the substrate and electrically coupled to the ROIC by thermal isolation legs.

13. The infrared detector element of claim 1, where the infrared detector membrane has at least one opening defined therein.

14. The infrared detector element of claim 13, where at least one opening comprises a plurality of openings configured as a grid of openings defined in the infrared detector membrane; and where the infrared detector element comprises a diffractive resonant cavity (DRC) microbolometer structure and further comprises a reflector disposed between the substrate and the infrared detector membrane and having an upper surface configured to reflect infrared radiation.

15. A focal plane array, comprising a plurality of infrared detector elements of claim 1.

16. A transitioned device structure, comprising:
a first dielectric insulative layer;
a first transition region disposed on the first dielectric insulative layer;
a conductive center region disposed on the first transition region, the conductive center region forming a current conduction channel for the device structure;
a second transition region disposed on the conductive center region, and
a second dielectric insulative layer disposed on the second transition region;
where at least a portion of each of the first and second transition regions has a lower conductivity than the conductive center region and a greater conductivity than the first and second dielectric insulative layers so as to space the current conduction channel apart from the interface with each of the first and second dielectric insulative layers in a manner that shields the current conduction channel from the interface with each of the first and second dielectric insulative layers.

17. The device structure of claim 16, where each of the first transition region, second transition region and conductive center region has a material matrix; and where the material matrix of each of the transition regions has substantially the same molecular structure as the molecular structure of the matrix of the conductive center region.

18. The device structure of claim 17, where the material matrix of each of the first transition region, second transition region and conductive center region comprises a semiconductor.

19. The device structure of claim 18, where the conductive center region further comprises at least one additional material in an amount sufficient to impart a conductivity to the conductive center region that is greater than the conductivity of the first and second transition regions.

20. The device structure of claim 18, where the conductive center region further comprises at least one additional material in an amount sufficient to impart a conductivity to the conductive center region that is greater than the conductivity of the first and second transition regions; and where the additional material comprises at least one of hydrogen, germanium, fluorine, carbon, n-type dopant, p-type dopant, or a combination thereof.

21. The device structure of claim 16, where a material matrix of each of the first transition region, second transition region and conductive center region comprises amorphous silicon.

22. The device structure of claim 16, where at least one of the following conditions exists:
the first transition region decreases in conductivity in a graded manner between a higher value of conductivity at an interface between the conductive center region and the first transition region, and a lower value of conductivity at an interface between the first transition region and the first dielectric insulative layer; or
the second transition region decreases in conductivity in a graded manner between a higher value of conductivity at an interface between the conductive center region and the second transition region, and a lower value of conductivity at an interface between the second transition region and the second dielectric insulative layer; or a combination thereof.

23. The device structure of claim 16, where the device structure forms an infrared detector membrane disposed in spaced relationship above a substrate.

24. A method for making the infrared detector element of claim 1, comprising:
provoiding the substrate; and
forming the infrared detector membrane disposed in spaced relationship above the substrate by:
forming the first dielectric insulative layer in spaced relationship above a surface of the substrate,
forming the first transition region disposed on the first dielectric insulative layer,
forming the conductive center region disposed on the first transition region,
forming the second transition region disposed on the conductive center region, and
forming the second dielectric insulative layer disposed on the second transition region;
where at least a portion of each of the first and second conductive transition regions has a lower conductivity than the conductive center region and a greater conductivity than the first and second dielectric insulative layers.

25. The method of claim 24, further comprising forming the conductive center region to have a material matrix that comprises at least one of an amorphous silicon matrix, an amorphous silicon germanium matrix; an amorphous silicon fluorine matrix; an amorphous silicon carbon matrix, a vanadium oxide matrix, a vanadium oxide amorphous silicon matrix, a titanium oxide matrix, a germanium matrix, a silicon germanium oxide matrix, or a nickel manganite spinel matrix.

26. The method of claim 24, further comprising forming the conductive center region to have a material matrix that comprises at least one of amorphous silicon, vanadium oxide, or a combination thereof.

27. The method of claim 24, further comprising forming each of the first transition region, second transition region and conductive center region to have a material matrix that comprises at least one of amorphous silicon, vanadium oxide, or a combination thereof.

28. The method of claim 24, further comprising sequentially depositing each of the first transition region, conductive center region and second transition region in a continuous deposition process within the same deposition chamber.

29. The method of claim 24, further comprising forming each of the first transition region, second transition region and conductive center region such that a material matrix of each of the transition regions has substantially the same molecular structure as the molecular structure of a matrix of the conductive center region.

30. The method of claim 29, further comprising forming the conductive center region to comprise at least one additional material in an amount sufficient to impart a conductivity to the conductive center region that is greater than the conductivity of the first and second transition regions.

31. The method of claim 24, further comprising forming each of the first transition region, second transition region and conductive center region to have a material matrix that comprises amorphous silicon; and forming the conductive center region to further comprise at least one additional material in an amount sufficient to impart a conductivity to the conductive center region that is greater than the conductivity of the first and second transition regions, the additional material comprising at least one of hydrogen, germanium, fluorine, carbon, n-type dopant, p-type dopant, or a combination thereof.

32. The method of claim 24, further comprising performing at least one of the following steps:
forming the first transition region to decrease in conductivity in a graded manner between a higher value of conductivity at an interface between the conductive center region and the first transition region, and a lower value of conductivity at an interface between the first transition region and the first dielectric insulative layer; or
forming the second transition region to decrease in conductivity in a graded manner between a higher value of conductivity at an interface between the conductive center region and the second transition region, and a lower value of conductivity at an interface between the second transition region and the second dielectric insulative layer; or
a combination thereof.

33. A method for making the transitioned device structure of claim 16, comprising:
forming the first dielectric insulative layer;
forming the first transition region disposed on the first dielectric insulative layer;
forming the conductive center region disposed on the first transition region to create a current conduction channel for the transitioned device structure;
forming a second transition region disposed on the conductive center region; and
forming the second dielectric insulative layer disposed on the second transition region;
where at least a portion of each of the first and second transition regions is formed to have a lower conductivity than the conductive center region and a greater conductivity than the first and second dielectric insulative layers so as to space the current conduction channel apart from the interface with each of the first and second dielectric insulative layers in a manner that shields the current conduction channel from the interface with each of the first and second dielectric insulative layers.

34. The method of claim 33, further comprising sequentially depositing each of the first transition region, second transition region and conductive center region in a continuous deposition process within the same vacuum chamber.

35. The method of claim 33, further comprising forming each of the first transition region, second transition region and conductive center region such that a material matrix of each of the transition regions has substantially the same molecular structure as the molecular structure of a matrix of the conductive center region.

36. The method of claim 35, further comprising forming the conductive center region to comprise at least one additional material in an amount sufficient to impart a conductivity to the conductive center region that is greater than the conductivity of the first and second transition regions.

37. The method of claim 36, further comprising forming each of the first transition region, second transition region and conductive center region to have a material matrix that comprises amorphous silicon; and forming the conductive center region to further comprise at least one additional material in an amount sufficient to impart a conductivity to the conductive center region that is greater than the conductivity of the first and second transition regions, the additional material comprising at least one of hydrogen, germanium, fluorine, carbon, n-type dopant, p-type dopant, or a combination thereof.

38. The method of claim 33, further comprising performing at least one of the following steps:
- forming the first transition region to decrease in conductivity in a graded manner between a higher value of conductivity at an interface between the conductive center region and the first transition region, and a lower value of conductivity at an interface between the first transition region and the first dielectric insulative layer; or
- forming the second transition region to decrease in conductivity in a graded manner between a higher value of conductivity at an interface between the conductive center region and the second transition region, and a lower value of conductivity at an interface between the second transition region and the second dielectric insulative layer; or
- a combination thereof.

* * * * *